US006644477B2

(12) United States Patent
Bores et al.

(10) Patent No.: US 6,644,477 B2
(45) Date of Patent: Nov. 11, 2003

(54) WAFER CONTAINER CUSHION SYSTEM

(75) Inventors: Gregory Bores, Prior Lake, MN (US); Michael Zabka, Eagan, MN (US); Barry Gregerson, Deephaven, MN (US)

(73) Assignee: Entegris, Inc., Chaska, MN (US)

( * ) Notice: Subject to any disclaimer, the term of this patent is extended or adjusted under 35 U.S.C. 154(b) by 0 days.

(21) Appl. No.: 10/317,006

(22) Filed: Dec. 11, 2002

(65) Prior Publication Data

US 2003/0159971 A1 Aug. 28, 2003

Related U.S. Application Data

(60) Provisional application No. 60/359,814, filed on Feb. 26, 2002.

(51) Int. Cl.[7] .............................................. B65D 85/30
(52) U.S. Cl. ........................................ 206/711; 206/454
(58) Field of Search ................................ 206/449, 454, 206/832, 710, 711, 712; 211/41.18

(56) References Cited

U.S. PATENT DOCUMENTS

| 5,711,427 A | * | 1/1998 | Nyseth | 206/710 |
|---|---|---|---|---|
| 5,782,362 A | * | 7/1998 | Ohori | 206/711 |
| 5,915,562 A | * | 6/1999 | Nyseth et al. | 206/710 |
| 6,105,781 A | * | 8/2000 | Ejima et al. | 206/710 |
| 6,267,245 B1 | * | 7/2001 | Bores et al. | 206/711 |
| 6,273,261 B1 | * | 8/2001 | Hosoi | 206/711 |
| 6,354,601 B1 | * | 3/2002 | Krampotich et al. | 277/628 |
| 6,428,729 B1 | * | 8/2002 | Bhatt et al. | 264/254 |

* cited by examiner

Primary Examiner—Shian Luong
(74) Attorney, Agent, or Firm—Patterson, Thuente, Skaar & Christensen, P.A.

(57) ABSTRACT

A wafer container having a container portion with an open front for receiving and removal of wafers includes a door with a cushion system that utilizes a unique wafer restraint system and structural features to provide maximum protection for the wafers and preventing rotation of said wafers. A feature of the door is that the front of the door covers have a pair of latch cavities on the outwardly facing side of the door. The latch cavities for receiving two latch mechanisms with latch members that extend out the upper and lower peripheral edge of the door. The latch mechanisms are covered by a pair of door panels that utilize hooks that attach to the peripheral edge of the door and further attach with posts near the vertical midsection. The latch cover at the peripheral side edge and at the vertical midsection of the door provides stiffness and resistance to bending of the door. In a preferred embodiment, the attachment of the door panel at the peripheral edge utilizes hook members on the door panel that extend through slots on the peripheral side. Press fit connectors and aperture combinations are preferably utilized to connect the edge of the latch panel approximate the mid-portion of the door.

20 Claims, 7 Drawing Sheets

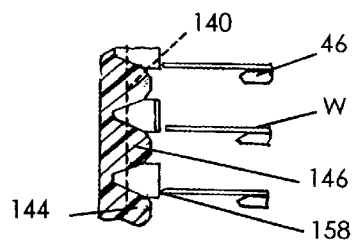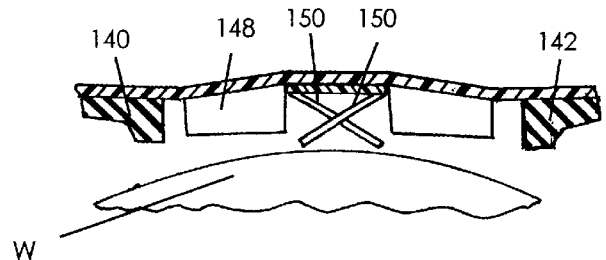
Figure 6a         Figure 6b
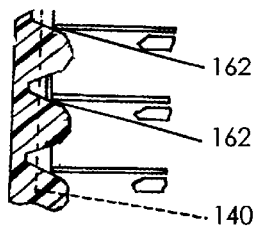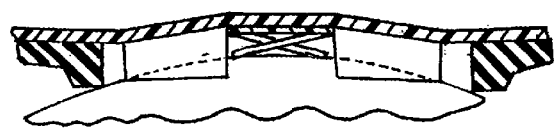
Figure 7a         Figure 7b
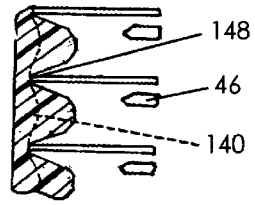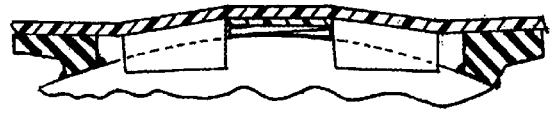
Figure 8a         Figure 8b
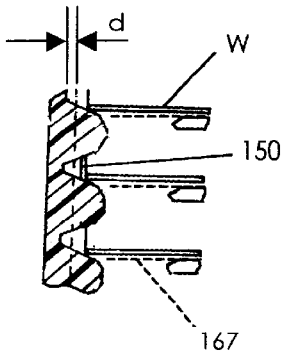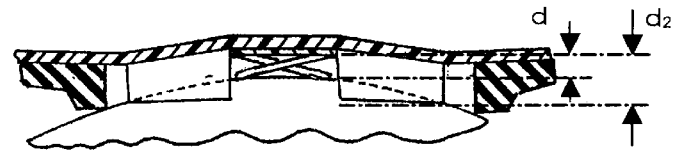
Figure 9a         Figure 9b

WAFER CONTAINER CUSHION SYSTEM

This application claims the benefit under 35 U.S.C 119(e) of U.S. Provisional Application No. 60/359,814 filed on Feb. 26, 2002, a copy of which is incorporated fully herein by reference.

FIELD OF THE INVENTION

This invention relates to wafer carriers, more particularly it relates to front opening wafer containers with doors having wafer restraints.

BACKGROUND OF THE INVENTION

In the processing of wafers into semiconductors, particularly integrated circuit, numerous steps must be performed and the wafers must often be transported facility to facility and internally within a facility in their immediate processing steps. Wafers must be protected during such transportation and storage and immediate processing steps. Recently, semiconductor wafers have increased in size to being as large as 300 mm in diameter. Moreover, the density of circuits on such wafers has dramatically increased. As a result, such wafers are significantly more expensive and protecting same from contamination and/or breaking is critical.

Various aspects of the inventions herein are particularly suitable for use with wafer containers that are commonly known as FOUPs (front opening unified pod) and FOSBs (front opening shipping boxes). These wafer containers have a container portion with interior wafer supports for holding a stack of horizontal wafers in an axially spaced arrangement in the interior of said container portion. Container portion has a front door that allows insertion and removal of the wafers and a door sealingly engages onto the wafer container to latch and seal thereon. Such boxes are, for example, illustrated in U.S. Pat. Nos. 6,267,245; 6,216,874; 6,206,196; 6,010,008; 5,944,194, all of which are owned by the owner of this application and are hereby incorporated in their entireties by reference herein. A generic prior art carrier is depicted in FIG. 1. The wafer container is shown seated on automatic processing equipment 25, and generally includes a container portion 20 and a door 22. The container portion 20 has an open front 24, a top 23, a pair of sides 28, 29, a back side 32, and a bottom 34. A door frame 36 defines the open front and is configured for receiving the door 22. The container portion may have a robotic handling flange 42. Wafer supports 46 in the interior of the container portion support wafers (not shown) that are aligned in a horizontal orientation in a stacked space array. The door has an outwardly facing side 50 and an inwardly facing side 52 and a periphery 54. The periphery 54 has latch slots 58 on the outwardly facing side. An exterior panel 62, which may be the principal structural panel of the door, covers latch mechanisms (not shown) associated with the keyholes 68 and that have latch members (not shown in this view), which extend out of the latch slots 58. Generally, the elements illustrated in FIG. 1 are common to front opening 300 mm wafer containers. Generally, in these types of carries, no consideration is made to prevention of rotation of the wafers during shipping. Such rotation is desirably avoided.

SUMMARY OF THE INVENTION

A wafer container having a container portion with an open front for receiving and removal of wafers further includes a door with a cushion system that utilizes a unique wafer restraint system and structural features to provide maximum protection for the wafers and preventing rotation of said wafers. In a preferred embodiment, a stack of wafers in the container portion with their front edges exposed are engaged by a pair of elastomeric cushions mounted on a front surface of the door. Additionally, deflectable wafer springs extend outwardly from the door for making first and last contact with the wafer edges as the door is seated and removed respectively. The inside face of the door may utilize wafer pockets in association with the system that are integrally molded or formed into the door housing.

A feature and advantage of the invention is that the elastomeric cushions prevent rotation of the wafers in the wafer container by softly gripping, with a very high coefficient of friction, the edges of the wafers.

A further feature and advantage of the invention is that, upon removal of the door from a container portion that is fully loaded, the wafer springs operate to restrain the wafers in place in the container portion as the elastomeric cushions are pulled away from engagement with the wafer edges. This prevents the sticking of the wafers to the elastomeric cushions and eliminates the potentially catastrophic result of the wafers following the door as the door is being removed.

A further feature and advantage of the invention is that the use of the elastomeric cushion minimizes wafer breakage and lowers the door closure force.

A further feature of the wafer carrier is a door that may utilize a dome shaped configuration on the inside surface to provide maximum resistance of the door structure to deformation when the door, specifically the wafer restraint system on the door, is in place and in a restraining position with the stack of wafers. In preferred embodiments, the dome structure is provided on the inside facing panel of the door by providing inward recesses at the four inside corners adjacent to the door periphery and sloping the inside facing panel such that said panel generally towards the wafers near the mid-portions of the peripheral sides and the mid-portion of the peripheral to and bottom of said door.

A further feature of the door is that the front of the door covers have a pair of latch cavities on the outwardly facing side of the door. The latch cavities for receiving two latch mechanisms with latch members that extend out the upper and lower peripheral edge of the door. The latch mechanisms are covered by a pair of door panels that utilize hooks that attach to the peripheral edge of the door and further attach with posts near the vertical midsection. The latch cover at the peripheral side edge and at the vertical midsection of the door provides stiffness and resistance to bending of the door. In a preferred embodiment, the attachment of the door panel at the peripheral edge utilizes hook members on the door panel which extend through slots on the peripheral side. Press fit connectors and aperture combinations are preferably utilized to connect the edge of the latch panel approximate the midportion of the door.

A feature and advantage of the wafer restraint system as disclosed herein is that the system imposes significantly less load on the wafers than alternative wafer restraint systems.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

FIG. 6A is a vertical cross-sectional view of the wafer restraint system during insertion of the door and prior to contact with the wafers;

FIG. 6B is a horizontal cross-section of the wafer restraint system during insertion of the door and prior to contact with the wafers;

FIG. 7A is a vertical cross-section of the wafer restraint system during insertion of the door, after the wafers have contacted the wafer springs and before the wafers have compressed the elastomeric cushions;

FIG. 7B is a horizontal cross-section of the wafer restraint system during insertion of the door, after the wafers have contacted the wafer springs and before the wafers have compressed the elastomeric cushions;

FIG. 8A is a vertical cross-section of the wafer restraint system with the door inserted and fully seated;

FIG. 8B is a horizontal cross-section of the wafer restraint system with the door inserted and fully seated;

FIG. 9A is a vertical cross-section of the wafer restraint system during removal of the door;

FIG. 9B is a horizontal cross-section of the wafer restraint system during removal of the door;

DETAILED DESCRIPTION OF THE PREFERRED EMBODIMENT

Figure 1:
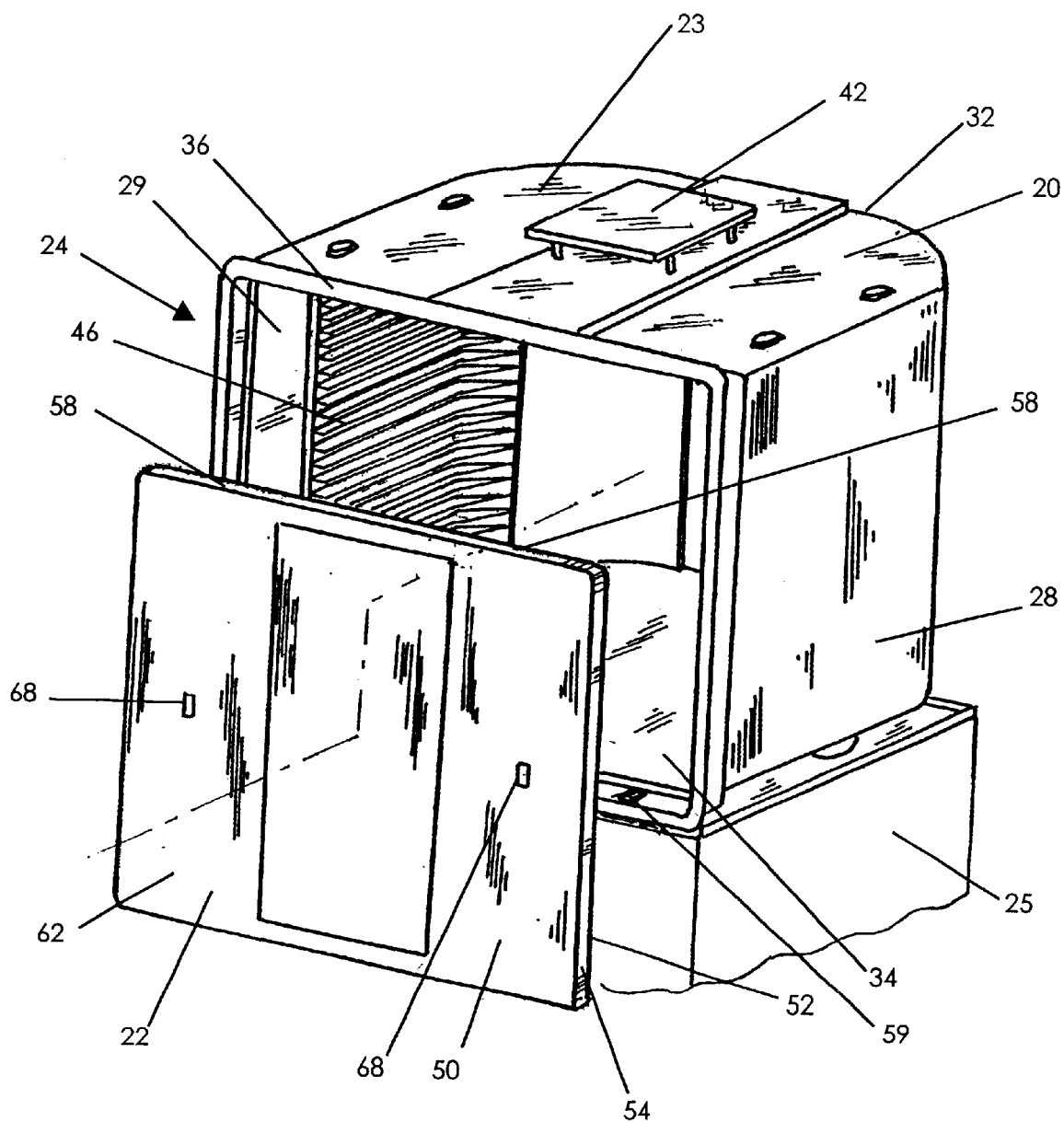
FIG. 1 is an exemplary view of a prior art wafer container.
Figure 2:
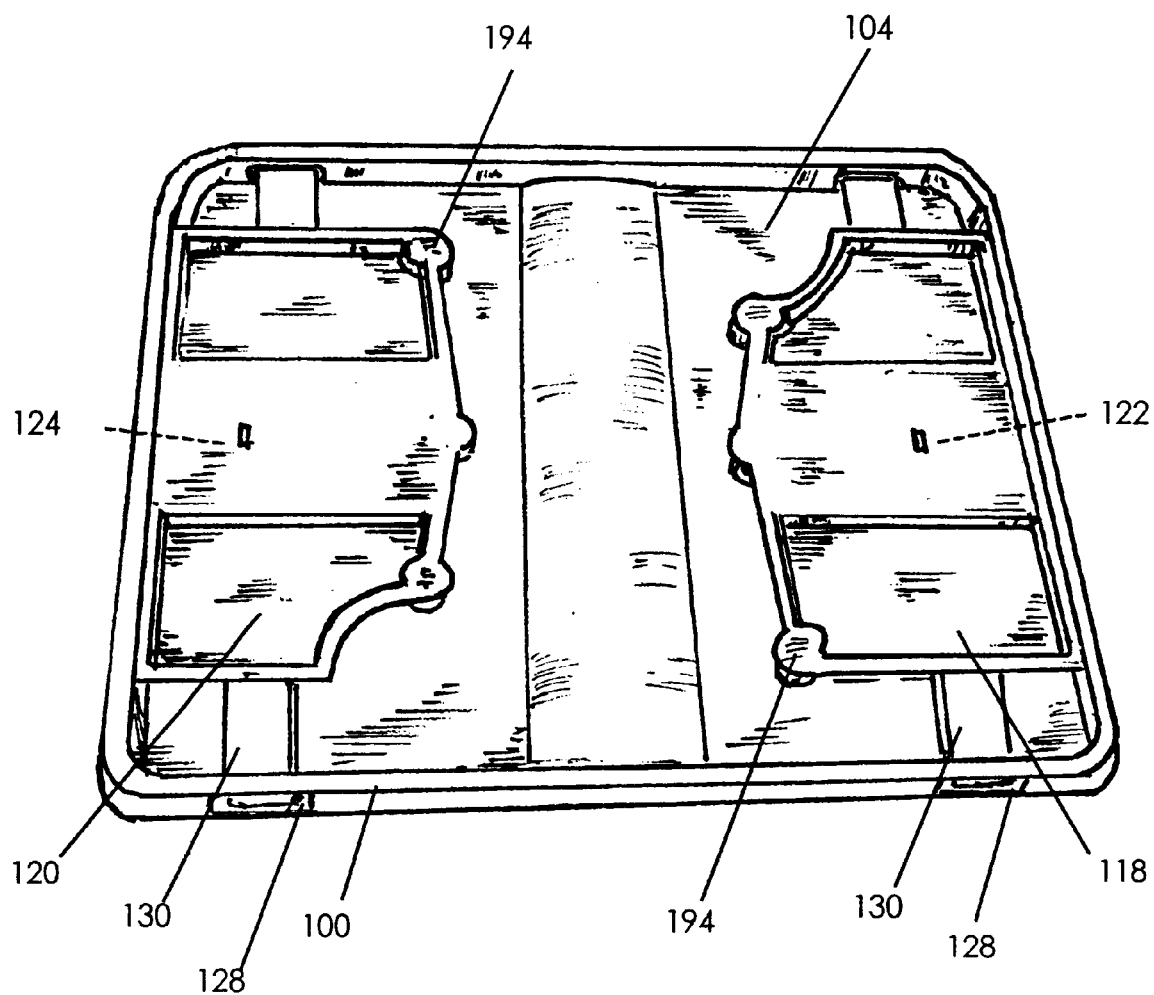
FIG. 2 is a perspective view of the outwardly facing or front side of a wafer container door in accordance with the invention herein.
Figure 3:
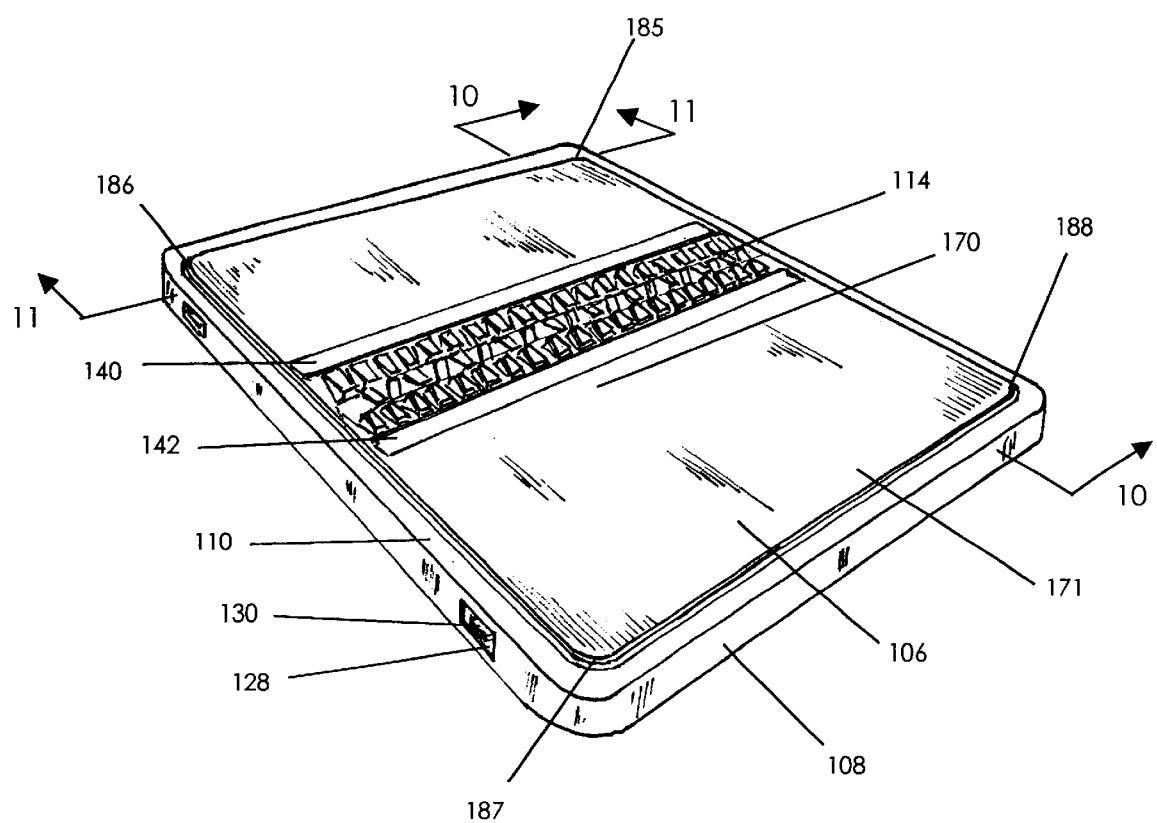
FIG. 3 is a perspective view of the inwardly facing or backside of the wafer carrier door of FIG. 2.

Referring to FIGS. 2 and 3, a door 100 is depicted that includes particular embodiments of the inventions herein. The door has an outwardly facing side 104 and an inwardly facing side 106. Extending around the periphery 108 is a seal member 110. On the inside surface is a wafer restraint system 114. On the outwardly facing side a pair of latch mechanism panels 118, 120 cover latch mechanisms 122, 124. The door periphery has slots 128 through which the latch members 130 extend to engage with latch receptacles such as depicted in FIG. 1 with the numeral 59.

Figure 4:
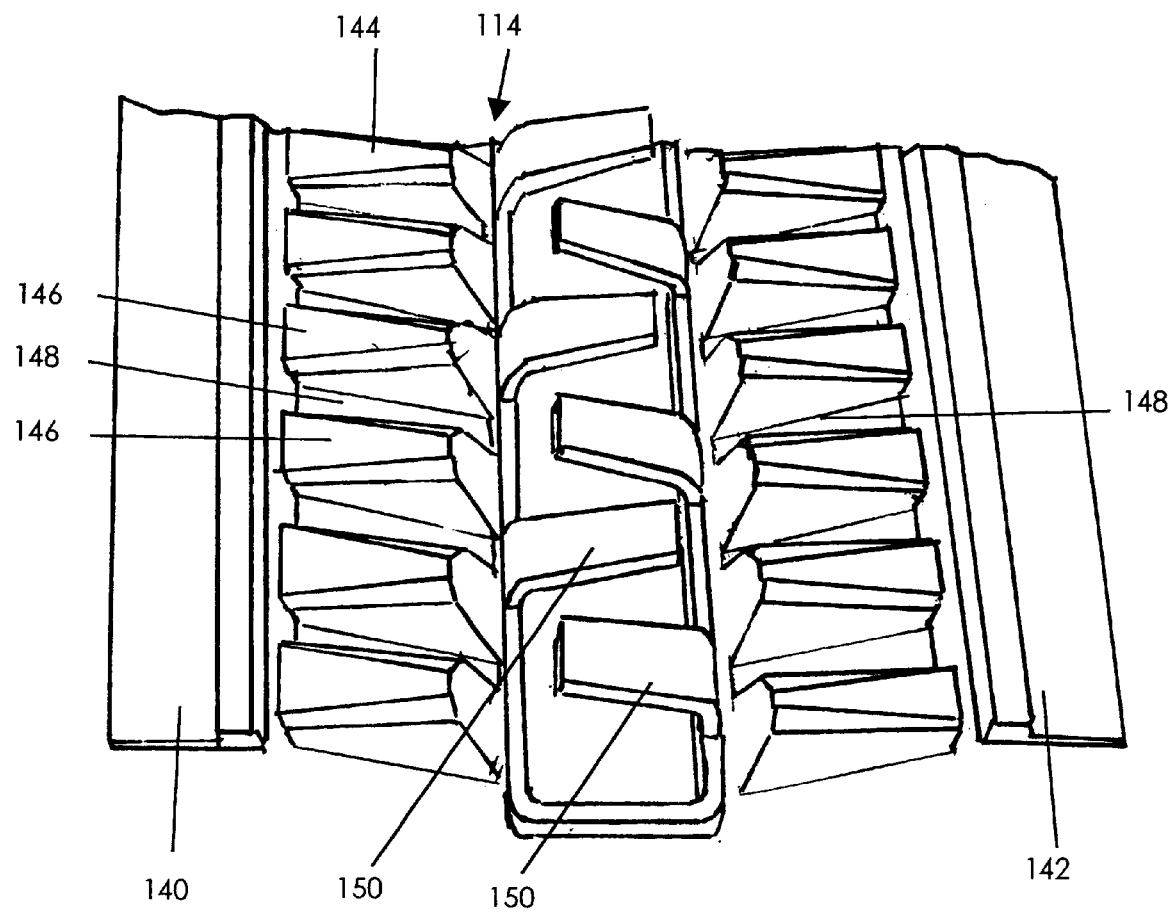
FIG. 4 is a detailed perspective view of the wafer restraint system.

Referring to FIGS. 3 and 4, details of a wafer restraint system illustrating preferred embodiments of the invention are depicted. In this embodiment, there are three distinct types of wafer restraints that combine synergistically to provide a reliable retention device that prevents wafer rotation, wafer breakage and minimizes door closure force.

The system may include a pair of elastomeric cushions 140, 142 that extend vertically upward along the inwardly facing side of the door. These cushions function, in part, to frictionally engage the edge of the wafers and thereby prevent rotation of the wafers in the container. These cushions may be formed from any elastomeric material suitable for use in a wafer container environment, including for example thermoplastic elastomers, such as urethane, polybutylene terephthalate, polyolefin, polyethylene terephthalate, styrenic block co-polymer, styrene-butadiene rubber, or polyether block polyamide.

Adjacent to the elastomeric cushions are two rows of corrugated portions 144 which have a plurality of teeth 146 defining a plurality of wafer pockets 148. In this preferred embodiment, the wafer teeth 146 are integral with the panel 149 that substantially defines the inwardly facing surface of the inside of the door.

Extending vertically down the center of the door is a row of deflectable wafer fingers or springs 150. These are preferably rigidly resilient fingers which may be made of material such as polyetheretheretherkeytone (PEEK). The functioning of these three distinct wafer restraints is part of the restraint system as illustrated in FIGS. 6A, 6B, 7A, 7B, 8A, 8B, 9A, and 9B. The system functions to first raise the wafers off of the wafer supports position at the sides of the container portion, then functions to "softly" cushion the edge of the wafers and prevent wafer rotation with the elastomeric material, and thirdly, releases the wafer edge from the elastomeric material as the door is removed from the container portion to prevent the wafer from following the door.

FIGS. 6A, 7A, 8A, and 9A illustrate cross-sectional views taken in the vertical through the wafer restraint system and FIGS. 6B, 7B, 8B, and 9B illustrate the corresponding views taken in a horizontal cross-section. Referring first to FIGS. 6A and 6B, these views illustrate the relative positioning of the wafers and wafer restraint system as the door is being inserted into the door frame. The wafers are in their resting position on the wafer supports 46 on the inside sides of the container portion. As illustrated, the edges of the wafers 158 are confronting, but not yet engaging, the wafer restraint system.

Referring to FIGS. 7A and 7B, the leading edge 158 of the wafers engages the inclined surfaces or ramps 162 of the wafer teeth 146. As the door is moved inwardly into position in the door frame the wafers ride up the ramps 162 and correspondingly deflect the wafer springs or fingers 150. As illustrated in this view, the wafer edges are not yet in contact with the resilient elastomeric cushion 140 shown by dashed lines.

In FIGS. 8A and 8B the wafer is shown fully seated in the wafer pockets 148 and in full engagement with the elastomeric wafer cushion 140 and the wafer springs 150 are fully deflected. FIGS. 8A and 8B illustrate the door then in the fully seated position and the door frame closing the open front of the door.

FIGS. 9A and 9B illustrate the action of the wafer W as the door is removed from the door frame. Initially the wafers will be seated onto the elastomeric cushion 140. As the door is removed the elastomeric cushion will uncompress a short distance D as illustrated in FIG. 9A. Simultaneously, the wafer springs 150, will also undeflect to the position as shown in FIG. 9A. The resilient elastomeric cushion due to its configuration only follows the wafer for a limited distance d. While the springs or wafer cushion fingers 150 continue to undeflect a greater distance d2. This effectively operates to separate the cushions from the elastomeric cushions, which may be somewhat sticky, and thus prevents the wafers from following the door during the removal motion. The wafers then may slide down the face or otherwise be lowered to the resting position on the wafer supports 46 as illustrated by the dashed lines labeled 167. Thus, the wafer springs deflect a greater distance d2 than the elastomeric cushions compress d, as shown in FIGS. 9A and 9B.

In addition to the currently most preferred embodiment illustrated, those of skill in the art will appreciate that a variety of alternate configurations of the three components of the wafer restraint system are possible within the scope of the present invention. For example, the wafer springs 150 shown in FIG. 4 may be replaced by any other rigidly resilient, non-sticky, structure, such as a single member with a "D" shaped cross-section. In such an embodiment, the D-shaped member is oriented vertically with the curved portion of the member facing into the carrier so as to confront the stack of wafers. In another alternative embodiment, the pair of elastomeric wafer cushions 140, 142, may be replaced by a single cushion member. Thus, the scope of the present invention may include any arrangement, configuration or combination in a wafer carrier door having an elastomeric wafer cushion element, a wafer positioning element such as the corrugated portions 144 of the illustrated embodiments, and a spring functioning element for disengaging the wafers from the elastomeric cushion.

Figure 10:
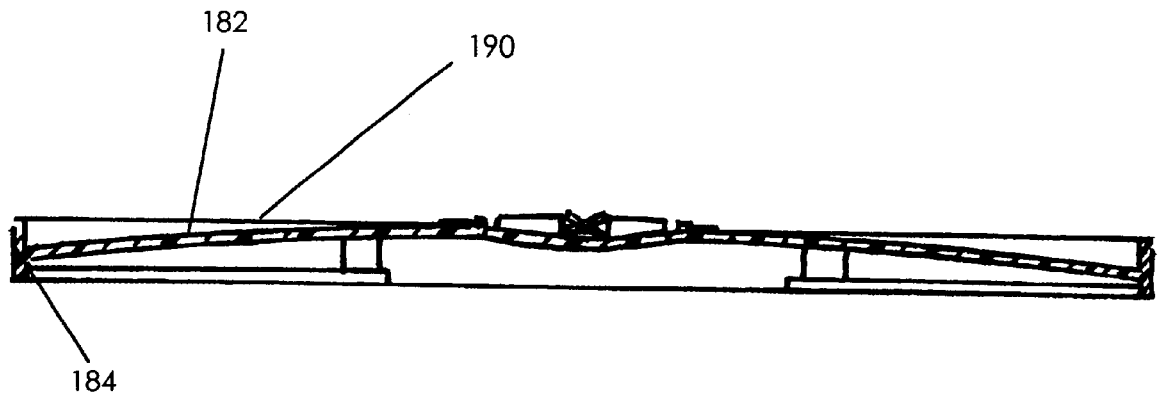
FIG. 10 is a cross-sectional view taken at line 10—10 of FIG. 3.
Figure 11:
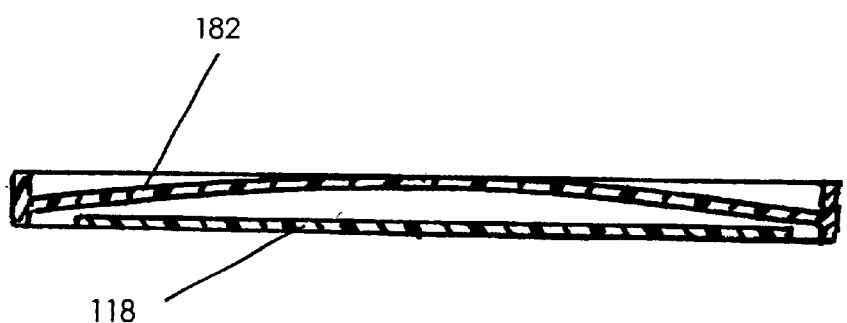
FIG. 11 is a cross-sectional view taken at line 11—11 of FIG. 3.

Referring to FIGS. 3, 10 and 11, another inventive aspect of the door is illustrated. The door comprises a main panel portion 182 which connects to a peripheral wall portion 184 that extends around the door periphery that confronts and slides within the door frame of the container portion when said door is received therein. The main panel portion 182 is recessed from the front 190 of the door at the corners 185, 186, 187, 188. The main panel portion 182 is inclined or sloped, and preferably arcuately bowed, from said recesses as the panel approaches the mid-areas intermediate the corners. Thus, there is a general dome or arcuate shape in between corners 185 and 188 as well as 185, 186, as well as 185 and 187. The center portion 170 of main panel 182 is positioned inwardly from the peripheral portion 171, giving the panel a general dish shape from a perspective outside of the carrier. The utilization of this general domed tendency in the configuration of the main traversing panel provides significant increase in structural strength to resist the deflection of the door due to loading caused by the engagement of the wafer restraint system with the stack of wafers in the container portion.

Figure 5:
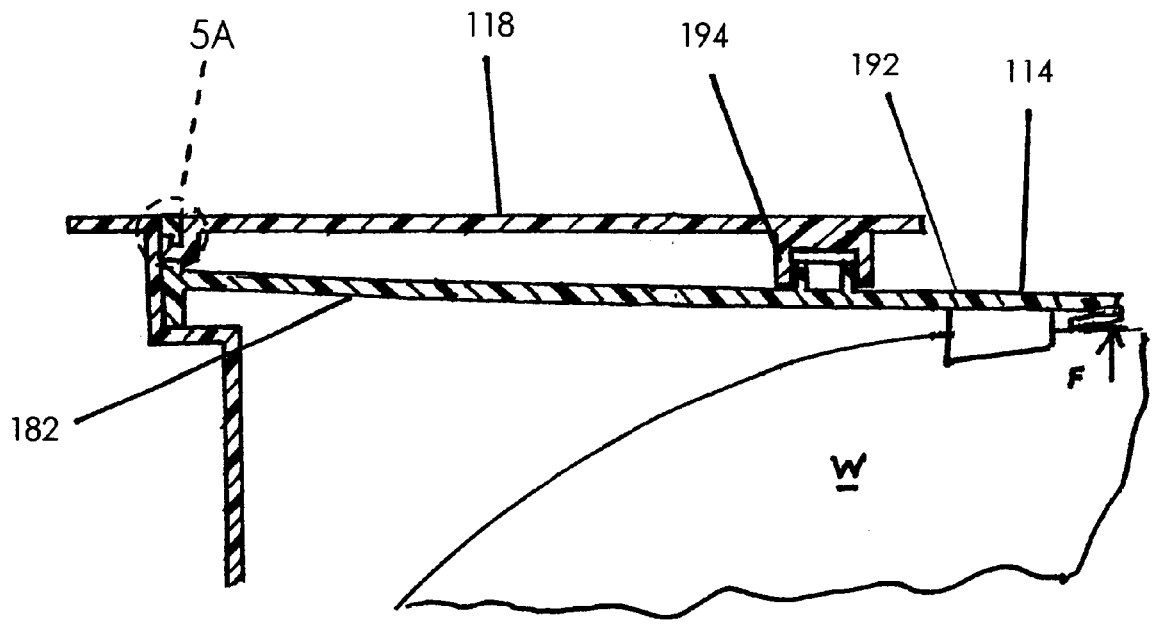
FIG. 5 is a horizontal cross-section view through a portion of a door engaged with a wafer carrier.
Figure 5A:
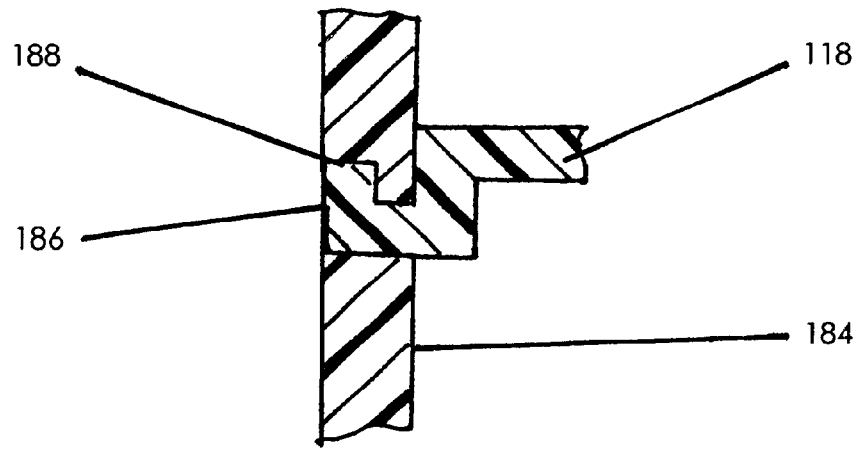
FIG. 5A is an enlarged, partial view of the door portion depicted in FIG. 5.

Referring to FIGS. 5 and 5A, another aspect of the invention is illustrated. This view is a cross-section through the door and wafer carrier showing a wafer W in place in the wafer restraint system 114. The latch mechanism cover 118 has a hook portion 186 as illustrated in detail in FIG. 5A that engages in an aperture 188 in the peripheral wall portion 184 of the door. The door latch panel cover 118 spans over the latch mechanism 122 and connects at the mid-portion 192 of the door at a plurality of post/aperture press-fit connectors 194. Such connectors may be as described in U.S. Pat. No. 6,216,874 owned by the owner of this application and hereby incorporated by reference in its entirety.

The secure connections at the press-fit connection 194 and the hook connection 186 provide structural rigidity to the left and right side of the door providing a significant improvement in rigidity that resists the force F provided by the stack of wafers when the door is in place as illustrated in FIG. 5. Generally, the latch mechanism cover 118 will subjected to a tensile of force upon application of the force F, in that the periphery is anchored to the door frame. This aspect of the invention provided for much improved resistance of this force by the latch cover panel 118 with little, if any, significant deflection.

Although the present invention has been described with reference to preferred embodiments, workers skilled in the art will recognize that changes may be made in form and detail without departing from the spirit and scope of the invention.

What is claimed is:

1. A wafer container for holding a plurality of wafers comprising:
   an enclosure portion having at least a top, a bottom, a pair of opposing sides, a back, and an open front; and
   a door, said door sealingly engagable with said enclosure portion so as to close the open front and having a wafer restraint system comprising:
   a corrugated portion having a plurality of teeth defining a plurality of wafer pockets;
   a pair of elastomeric cushions for cushioningly engaging the periphery of each wafer when said door is sealingly engaged with said enclosure portion; and
   a plurality of resilient wafer springs adapted to disengage each wafer from said elastomeric cushion portion when said door is disengaged from said enclosure portion.

2. The wafer container of claim 1, wherein said pair of elastomeric cushions is adapted and positioned so as to be deflected by the periphery of the wafer by a first distance when said door is engaged with said enclosure portion, wherein said resilient wafer springs are adapted and positioned so as to be deflected by the periphery of the wafer by a second distance when said door is engaged with said enclosure portion, and wherein said second distance is greater than said first distance.

3. The wafer container of claim 1, wherein said door comprises a main panel portion surrounded by a peripheral wall portion.

4. The wafer container of claim 3, wherein said corrugated portion of said wafer restraint is integrally formed in said main panel portion.

5. The wafer container of claim 3, wherein said main panel portion has a peripheral portion surrounding a center portion, and wherein said main panel portion is dish shaped so that said center portion is positioned inwardly from said peripheral portion when said door is engaged with said enclosure portion.

6. The wafer container of claim 3, wherein said peripheral wall portion has an aperture formed therein, and wherein the wafer container further comprises at least one latch mechanism cover having a periphery with a hook portion formed therein, said hook portion being adapted to engage said aperture, said latch mechanism cover further having a plurality of press-fit connectors, and wherein said latch mechanism cover is secured to said main panel portion by said press-fit connectors and by engaging said hook portion with said aperture.

7. A wafer container for holding a plurality of wafers comprising:
   an enclosure portion having at least a top, a bottom, a pair of opposing sides, a back, and an open front; and
   a door, said door sealingly engagable with said enclosure portion so as to close the open front and having a wafer restraint system comprising:
   a corrugated portion having a plurality of teeth defining a plurality of wafer pockets;
   an elastomeric cushion portion for cushioningly engaging the periphery of each wafer when said door is sealingly engaged with said enclosure portion; and
   a resilient spring portion for disengaging each wafer from said elastomeric cushion portion when said door is disengaged from said enclosure portion.

8. The wafer container of claim 7, wherein said elastomeric cushion portion is adapted and positioned so as to be deflected by the periphery of the wafer by a first distance when said door is engaged with said enclosure portion, wherein said resilient spring portion is adapted and positioned so as to be deflected by the periphery of the wafer by a second distance when said door is engaged with said enclosure portion, and wherein said second distance is greater than said first distance.

9. The wafer container of claim 7, wherein said door comprise saimain panel portion surrounded by a peripheral wall portion.

10. The wafer container of claim 9, wherein said corrugated portion of said wafer restraint is integrally formed in said main panel portion.

11. The wafer container of claim 9, wherein said main panel portion has a peripheral portion surrounding a center portion, and wherein said main panel portion is dish shaped so that said center portion is positioned inwardly from said peripheral portion when said door is engaged with said enclosure portion.

12. The wafer container of claim 9, wherein said peripheral wall portion has an aperture formed therein, and wherein the wafer container further comprises at least one latch mechanism cover having a periphery with a hook portion formed therein, said hook portion being adapted to engage said aperture, said latch mechanism cover further having a plurality of press-fit connectors, and wherein said latch mechanism cover is secured to said main panel portion by said press-fit connectors and by engaging said hook portion with said aperture.

13. A wafer container for holding a plurality of wafers comprising:
   an enclosure portion having at least a top, a bottom, a pair of opposing sides, a back, and an open front; and
   a door, said door sealingly engagable with said enclosure portion so as to close the open front and having a wafer constraint system comprising:
      cushioning means for cushioningly engaging the periphery of each wafer when said door is sealingly engaged with said enclosure portion;
      means for positioning each wafer for engagement by said cushioning means; and
      means for disengaging each wafer from said cushioning means when said door is disengaged from said enclosure portion.

14. The wafer container of claim 13, wherein said cushioning means comprises at least one cushion member formed from an elastomeric material, wherein said cushion member is positioned and adapted so as to be deflected by the periphery of the wafer by a first distance when said door is engaged with said enclosure portion, wherein said means for disengaging comprises a resilient spring portion, wherein said resilient spring portion is positioned and adapted so as to be deflected by the periphery of the wafer by a second distance when said door is engaged with said enclosure portion, and wherein said second distance is greater than said first distance.

15. The wafer container of claim 13, wherein said door comprises a main panel portion surrounded by a peripheral wall portion.

16. The wafer container of claim 15, wherein said means for positioning comprises a corrugated plurality of teeth forming a plurality of pockets, and wherein said teeth are integrally formed in said main panel portion.

17. The wafer container of claim 15, wherein said main panel portion has a peripheral portion surrounding a center portion, and wherein said main panel portion is dish shaped so that said center portion is positioned inwardly from said peripheral portion when said door is engaged with said enclosure portion.

18. The wafer container of claim 15, wherein said peripheral wall portion has an aperture formed therein, and further comprising at least one latch mechanism cover having a periphery with a hook portion formed therein, said hook portion being adapted to engage said aperture, said latch mechanism cover further having a plurality of press-fit connectors, and wherein said latch mechanism cover is secured to said main panel portion by said press-fit connectors and by engaging said hook portion with said aperture.

19. A method for restraining a plurality of wafers in a front opening wafer container comprising the steps of:
   providing a front opening wafer container having an enclosure portion comprising a top, a bottom, a pair of opposing sides, a back, and an open front, said wafer container further including a door sealingly engagable with said enclosure portion so as to close the open front, said door having an elastomeric cushion portion and a resilient spring portion, said cushion portion and said spring portion each positioned so as to engage the wafers when said door is engaged with said enclosure portion; and
   engaging said door with said enclosure portion, thereby deflecting said elastomeric cushion portion against the wafers by a first distance, and also thereby deflecting said resilient spring portion against the wafers by a second distance, said second distance being greater than said first distance.

20. A method for disengaging wafers from an elastomeric wafer restraint cushion in a front opening wafer carrier comprising the steps of:
   providing a front opening wafer container loaded with a plurality of wafers and having an enclosure portion with an open front, said wafer container further including a door sealingly engagable with said enclosure portion so as to close the open front, said door having an elastomeric cushion portion and a resilient spring portion, said cushion portion positioned so as to be deflected against the wafers by a first distance when said door is engaged with said enclosure portion, said spring portion positioned so as to be deflected against the wafers by a second distance when said door is engaged with said enclosure portion, said second distance being greater than said first distance; and
   disengaging said door from said enclosure portion, thereby undeflecting said cushion portion and said spring portion.

* * * * *